(12) United States Patent
Waki

(10) Patent No.: US 7,378,996 B2
(45) Date of Patent: May 27, 2008

(54) SAMPLING RATE CONVERSION CALCULATING APPARATUS

(75) Inventor: Hiroyuki Waki, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/660,516

(22) PCT Filed: Aug. 29, 2005

(86) PCT No.: PCT/JP2005/015668

§ 371 (c)(1),
(2), (4) Date: Feb. 20, 2007

(87) PCT Pub. No.: WO2006/025332

PCT Pub. Date: Mar. 9, 2006

(65) Prior Publication Data

US 2007/0257711 A1    Nov. 8, 2007

(30) Foreign Application Priority Data

Aug. 30, 2004    (JP) .............................. 2004-249765

(51) Int. Cl.
*H03M 7/00* (2006.01)
(52) U.S. Cl. ........................ 341/61; 708/290; 708/300; 708/313
(58) Field of Classification Search .................... 341/61
See application file for complete search history.

(56) References Cited

U.S. PATENT DOCUMENTS 5,729,225 A * 3/1998 Ledzius ........................ 341/61
5,825,899 A * 10/1998 Yamaguchi et al. ....... 381/94.4
5,963,153 A * 10/1999 Rosefield et al. ............. 341/61
6,057,789 A * 5/2000 Lin .............................. 341/61

FOREIGN PATENT DOCUMENTS

| JP | 63-296511 | 12/1988 |
|----|-----------|---------|
| JP | 8-46484 | 2/1996 |
| JP | 8-321745 | 12/1996 |
| JP | 11-191724 | 1/1999 |
| JP | 11-213558 | 8/1999 |
| JP | 2001-256730 | 9/2001 |

* cited by examiner

*Primary Examiner*—Khai M Nguyen
(74) *Attorney, Agent, or Firm*—Wenderoth, Lind & Ponack, L.L.P.

(57) ABSTRACT

There provided is a low-cost, high performance sampling rate conversion calculating apparatus which achieves both a low delay characteristic required for conversational voice data and high quality required for audio data in a concurrent manner. A first digital signal processing section outputs conversational voice data, which requires the low delay characteristic, in accordance with a sampling frequency of an output terminal (111). A second digital signal processing section outputs audio data, which requires the high quality, rather than the low density characteristic, in accordance with the sampling frequency of the output terminal (111). An adder section (107) adds the conversational voice data outputted from the first digital signal processing section and the audio data outputted from the second digital signal processing section and outputs the added data from the output terminal (111).

14 Claims, 14 Drawing Sheets

F I G. 1
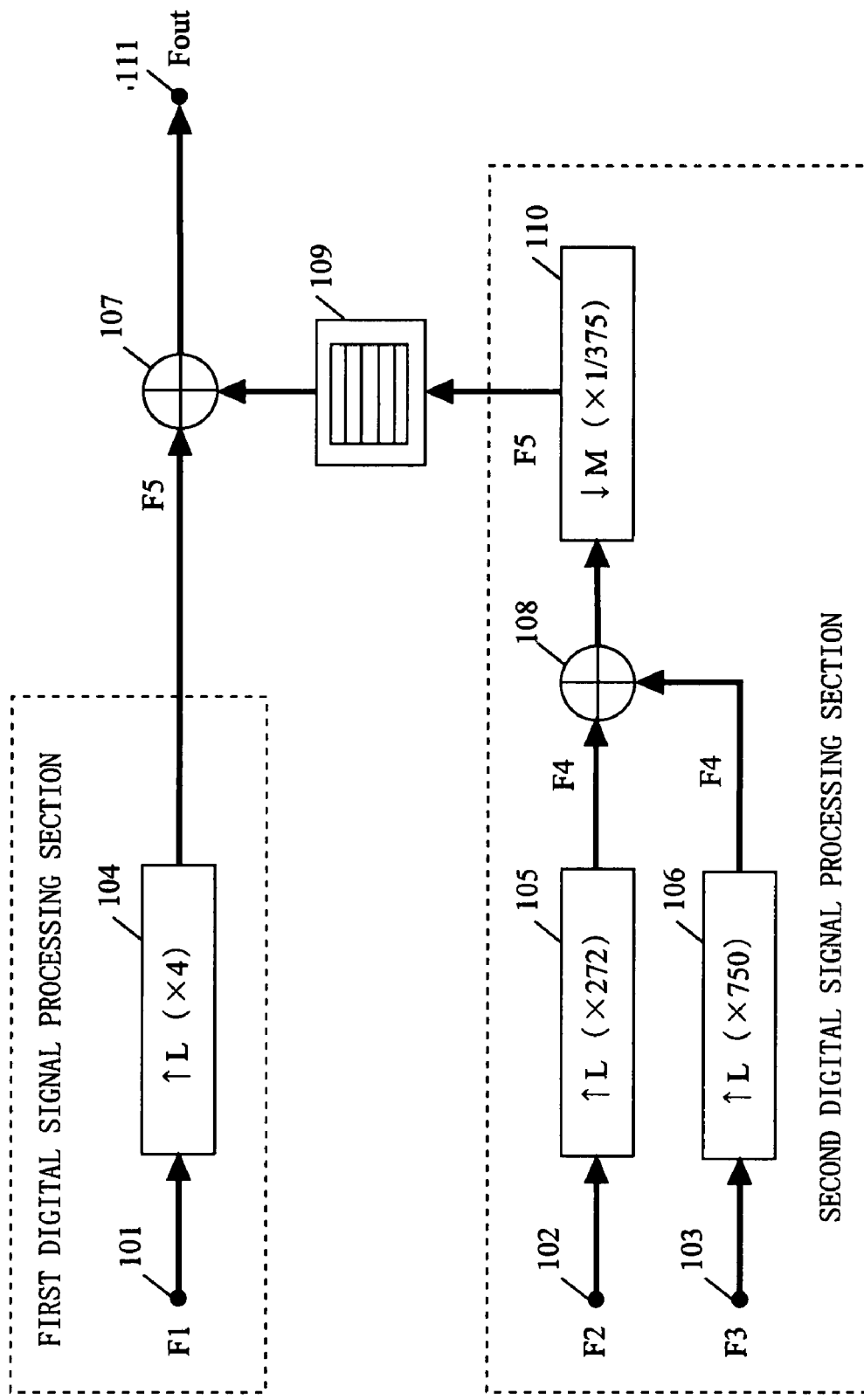

FIG. 2

| SIGNAL | REFERENCE FREQUENCY (kHz) | SAMPLING FREQUENCY (Hz) | REFERENCE CLOCK FREQUENCY (SAMPLING FREQUENCY INTERVAL) | REAL SAMPLING FREQUENCY (Hz) | MULTIPLE RATIO | DATA EXAMPLE |
|---|---|---|---|---|---|---|
| F1 | 384 | 8,000 | 48 (125.00μsec) | 8,000 | 4 | CONVERSATIONAL VOICE (3GPP AMR) |
| F2 | 27,000 | 44,100 | 612 (22.67μsec) | 44,118 (=612clock* 27MHz) | 272 | AUDIO (AAC FOR BROADCASTING) |
| F3 | 384 | 16,000 | 24 (62.50μsec) | 16,000 | 750 | AUDIO (AAC FOR MOBILE COMMUNICATIONS) |
| F4 | 12,000 | 12,000,000 | 1 (0.08μsec) | 12,000,000 | 1 | FOR INTERNAL PROCESSING |
| F5 (=Fout) | 12,000 | 32,000 | 375 (31.25μsec) | 32,000 | 375 | FOR OUTPUTTING |

F I G. 3
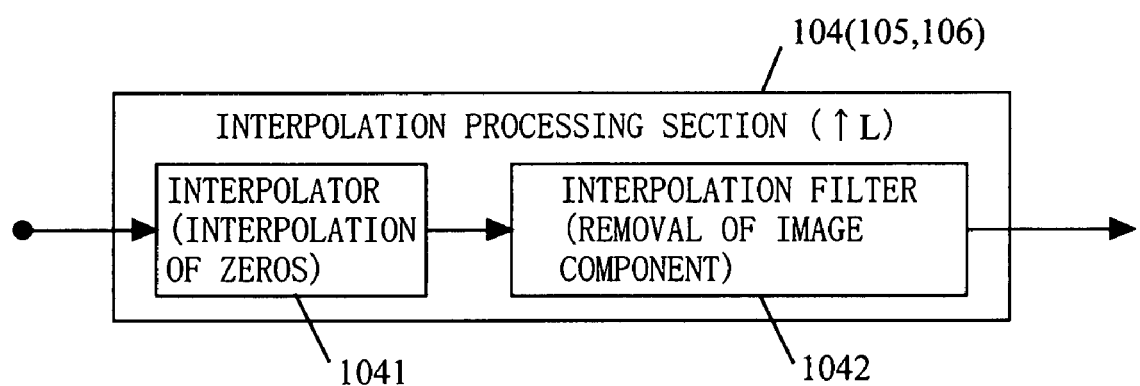

F I G. 1 6 PRIOR ART

| SIGNAL | REFERENCE FREQUENCY (kHz) | SAMPLING FREQUENCY (Hz) | REFERENCE CLOCK FREQUENCY (SAMPRING FREQUENCY INTERVAL) | REAL SAMPLING FREQUENCY (Hz) | MULTIPLE RATIO | DATA EXAMPLE |
|---|---|---|---|---|---|---|
| F11 | 384 | 8,000 | 48 (125.00μsec) | 8,000 | 1,500 | CONVERSATIONAL VOICE (3GPP AMR) |
| F12 | 27,000 | 44,100 | 612 (22.67μsec) | 44,118 (=612clock* 27MHz) | 272 | AUDIO (AAC FOR BROADCASTING) |
| F13 | 384 | 16,000 | 24 (62.50μsec) | 16,000 | 750 | AUDIO (AAC FOR MOBILE COMMUNICATIONS) |
| F14 | 12,000 | 12,000,000 | 1 (0.08μsec) | 12,000,000 | 1 | FOR INTERNAL PROCESSING |
| F15 | 12,000 | 32,000 | 375 (31.25μsec) | 32,000 | 375 | FOR OUTPUTTING |

SAMPLING RATE CONVERSION CALCULATING APPARATUS

This application is a 371 of PCT/JP05/15668 filed Aug. 29, 2005 which claims priority to Japanese application No. 2004-249765 filed Aug. 30, 2004.

TECHNICAL FIELD

The present invention relates to a sampling rate conversion calculating apparatus, and more particularly to a sampling rate conversion calculating apparatus which converts sampling rates of a plurality of digital signal sequences.

BACKGROUND ART

In the wake of an evolution of digital devices in recent years, a variety of signal processing circuits, which had been conventionally realized by analog circuits, have been realized by digital signal processing.

In digital signal processing, various processes are realized by using a digital signal sequence which is obtained by sampling upon discretization an input signal to be quantized by digital values. In a linear time invariant system which is commonly used in general, because a sampling time interval is assumed to be constant, digital signal sequences whose sampling time intervals vary cannot be equally processed.

The sampling rate conversion calculating apparatus (or resampling system) is an apparatus for converting a sampling time interval of a digital signal sequence. A conventional sampling rate conversion calculating apparatus comprises an interpolation processing section for narrowing a sampling interval (an inverse number is referred to as a "sampling frequency") to one integer-th thereof and a decimation processing section for lengthening a sampling interval to an integral multiple thereof (for example, refer to patent document 1). FIG. 15 is a block diagram illustrating a configuration of the conventional sampling rate conversion calculating apparatus. In FIG. 15, the conventional sampling rate conversion calculating apparatus comprises an input terminal 301, an interpolation processing section 302, a signal line 303, a decimation processing section 304, and an output terminal 305.

A digital signal sequence inputted to the interpolation processing section 302 is outputted from the signal line 303 as a signal whose sampling interval is narrowed to one integer-th thereof through interpolation processing. In the digital signal sequence which has been interpolation-processed, a data amount of a sample point is increased by a multiple of the narrowed sampling interval. In order to decimate the increased data amount, the decimation processing section 304 adjusts the data amount by lengthening the sampling interval of the digital signal sequence to an integral multiple.

By performing a series of these processes, the conventional sampling rate conversion calculating apparatus converts a sampling interval with a rational number ratio for the digital signal sequence inputted from the input terminal 301 and outputs from the output terminal 305 the digital signal sequence obtained after the conversion.

Patent document 1: Japanese Laid-Open Patent Publication No. 8-46484

DISCLOSURE OF THE INVENTION

Problems to be Solved by the Invention

In a case where audio data on which high sound quality is required and conversational voice data on which low delay, rather than the high sound quality, is required are, concurrently processed for combine, because a frequency corresponding to a least common multiple of a frequency which is reference for respective sampling intervals is extremely high, the conventional sampling rate conversion calculating apparatus has a problem of a remarkable increase in a load for processing the conversational voice data.

For example, a case where the conventional sampling rate conversion calculating apparatus processes concurrently, for combine, three digital signal sequences F11 to F13 whose sampling frequencies vary and outputs a digital signal sequence F15 is considered. In an example shown in FIG. 16, the digital signal sequences F11 to F13 are digital signal sequences of conversational voice and audio, etc., used in general. Here, as the digital signal sequence F11, decode data of AMR, which has been sampled at 8 kHz in 384 kHz which is a standard used for mobile communications, is inputted. As the digital signal sequence F12, decode data of AAC, which has been sampled at 44.1 kHz in 27 MHz which is a standard used for broadcasting, is inputted. As the digital signal sequence F13, decode data of AAC, which has been sampled at 16 kHz in 384 kHz which is a standard used for mobile communications, is inputted.

And a sampling frequency of the digital signal sequence F15 outputted from the output terminal 305 is 32 kHz in 12 MHz in consideration of affinity with an MIDI apparatus etc in which an internal clock is used. In FIG. 16, the sampling frequency of the digital signal sequence F11 and the sampling frequency of the digital signal sequence F15 are in a relationship of an integer ratio (i.e., F11:F15=1:4).

In such a case, each of the digital signal sequences F11, F12, and F13, which is entered from the input terminal 301, must be adjusted to the same sampling frequency (12 MHz: it is used for the internal processing, shown as F14) for signal combination by the interpolation processing section 302. The decimation processing section 304 has to decimation-process the digital signal sequence F14, whose sampling frequency is 12 MHz, in order to be the digital signal sequence F15, whose sampling frequency is 32 kHz.

Because the digital signal sequence F1 has a sampling interval of 125 μsec, when the sampling interval is narrowed by adjusting the sampling frequency to 12 MHz, a data amount increases 1500 times. In addition, because the digital signal sequence F1 is the conversational voice data, it is required to limit a delay time within a given period of time. If processing is not frequently performed, there accrues a gap between signals of non-verbal sounds, such as responding voices, of a speaker and a listener, drastically deteriorating quality of conversation.

Therefore, in the conventional sampling rate conversion calculating apparatus, the interpolation processing section 302 and the decimation processing section 304 are required to always operate in a frequent processing under a high load, whereby a large load is exerted on a system, resulting in an increase in a hardware cost and an increase in power consumption.

Hence, an object of the present invention is to provide a sampling rate conversion calculating apparatus, in which low delay required for conversational voice data and sound quality required for audio data are concurrently satisfied, achieving a low cost and high performance.

Solution to the Problems

The present invention is intended for an apparatus which has a sampling rate conversion function to adjust sampling frequencies from two (or more) digital signal sequences which have different sampling frequencies. In order to achieve the above purpose, the sampling rate conversion calculating apparatus of the present invention comprises a first digital signal processing section, a second digital signal processing section, a signal adder section, and an output terminal.

The first digital signal processing section increases a sampling frequency of the first digital signal sequence by multiplying the sampling frequency of the first digital signal sequence by an integer. The second digital signal processing section multiplies a sampling frequency of the second digital signal sequence by a rational number which varies. The adder section adds the digital signal sequence outputted from the first digital signal processing section and the digital signal sequence outputted from the second digital signal processing section. The output terminal outputs a digital signal sequence into which the adder section has added the digital signal sequences. The first digital signal processing section determines the integer by which the sampling frequency of the first digital signal sequence is multiplied for increasing the sampling frequency of the first digital signal sequence in order to adjust the sampling frequency of the first digital signal sequence to the sampling frequency of the output terminal. The second digital signal processing section determines a rational number, which varies, by which the sampling frequency of the second digital signal sequence is multiplied in order to adjust the sampling frequency of the second digital signal sequence to the sampling frequency of the output terminal.

The first digital signal sequence is conversational voice data. In this case, the first digital signal processing section increases the sampling frequency of the conversational voice data by multiplying the sampling frequency of the conversational voice data by the integer. And the second digital signal sequence is audio data. In this case, the second digital signal processing section multiplies the sampling frequency of the audio data by a rational number which varies.

Preferably, the sampling rate conversion calculating apparatus further comprises a buffer, between the adder section and the second digital signal processing section, for temporarily storing the digital signal sequence outputted by the second digital signal processing section.

Preferably, the first digital signal processing section includes an input terminal to which the first digital signal sequence is inputted, and an interpolation processing section for increasing the sampling frequency of the first digital signal sequence by multiplying the sampling frequency of the first digital signal sequence by the integer.

Preferably, the second digital signal processing section includes an input terminal to which the second digital signal sequence is inputted, an interpolation processing section for increasing the sampling frequency of the second digital signal sequence by multiplying the sampling frequency of the second digital signal sequence by the integer, and a decimation processing section for decreasing the sampling frequency of the digital signal sequence by multiplying the sampling frequency of the digital signal sequence outputted by the interpolation processing section by a reciprocal of the integer in order to adjust the sampling frequency of the digital signal sequence to the sampling frequency of the output terminal.

And the second digital signal processing section includes a plurality of input terminals to which the plurality of digital signal sequences including the second digital signal sequence are inputted, a plurality of interpolation processing sections for increasing the sampling frequencies of the plurality of digital signal sequences by respectively multiplying the sampling frequencies of the plurality of digital signal sequences by the integer so that the sampling frequencies of the plurality of digital signal sequences are adjusted to coincide with each other, a second adder section for adding the digital signal sequences outputted by the plurality of interpolation processing sections, and a decimation processing section for decreasing the sampling frequencies of the digital signal sequences by multiplying the sampling frequencies of the digital signal sequences outputted by the second adder section by a reciprocal of the integer in order to adjust the sampling frequencies of the digital signal sequences to the sampling frequency of the output terminal.

The first digital signal processing section may include an input terminal to which the first digital signal sequence is inputted, and a collinear approximation section for increasing the sampling frequency of the first digital signal sequence by multiplying the sampling frequency of the first digital signal sequence by the integer.

And the second digital signal processing section may include an input terminal to which the second digital signal sequence is inputted, a collinear approximation section for increasing the sampling frequency of the second digital signal sequence by multiplying the sampling frequency of the second digital signal sequence by the integer, and a decimation processing section for decreasing the sampling frequency of the digital signal sequence by multiplying the sampling frequency of the digital signal sequence outputted by the collinear approximation section by a reciprocal of the integer in order to adjust the sampling frequency of the digital signal sequence to the sampling frequency of the output terminal.

The second digital signal processing section may include a plurality of input terminals to which the plurality of digital signal sequences including the second digital signal sequence are inputted, a plurality of collinear approximation sections for increasing the sampling frequencies of the plurality of digital signal sequences by respectively multiplying the sampling frequencies of the plurality of digital signal sequences by the integer so that the sampling frequencies of the plurality of digital signal sequences are adjusted to coincide with each other, a second adder section for adding the digital signal sequences outputted by the plurality of collinear approximation section, and a decimation processing section for decreasing the sampling frequencies of the digital signal sequences by multiplying the sampling frequencies of the digital signal sequences outputted by the second adder section by a reciprocal of the integer in order to adjust the sampling frequencies of the digital signal sequences to the sampling frequency of the output terminal.

Preferably, the sampling frequency of the output terminal is a multiple of the sampling frequency of conversational voice data. And a reference frequency of the sampling frequency of the digital signal sequence to be inputted to the second digital signal processing section is either one of 27 MHz, 382 kHz, and 12 MHz.

The present invention is also intended for a conversion method for converting two or more digital signal sequences which have different sampling frequencies into the same sampling frequency. In order to achieve the above purpose, the conversion method comprises a first digital signal processing step and a second digital signal processing step, a signal addition step, and an output step. At the first digital signal processing step, a sampling frequency of a first digital signal sequence is multiplied by an integer and thereby the sampling frequency of the first digital signal sequence is increased. At the second digital signal processing step, a sampling frequency of the second digital signal sequence is multiplied by a rational number which varies. At the addition step, the digital signal sequence outputted at the first digital signal processing step and the digital signal sequence outputted at the second digital signal processing step are added. At the output step, a digital signal sequence added at the addition step is outputted from the output terminal. At the first digital signal processing step, determined is an integer by which the sampling frequency of the first digital signal sequence is multiplied for increasing the sampling frequency of the first digital signal sequence in order to adjust the sampling frequency of the first digital signal sequence to the sampling frequency of the output terminal. At the second digital signal processing step, determined is a rational number, which varies, by which the sampling frequency of the second digital signal sequence is multiplied in order to adjust the sampling frequency of the second digital signal sequence to the sampling frequency of the output terminal.

The present invention is also intended for an integrated circuit for converting two or more digital signal sequences which have different sampling frequencies into the same sampling frequency. In order to achieve the above purpose, the integrated circuit of the present invention comprises a first digital signal processing step and a second digital signal processing step, a signal addition step, and an output step. At the first digital signal processing step, a sampling frequency of a first digital signal sequence is multiplied by an integer and thereby the sampling frequency of the first digital signal sequence is increased. At the second digital signal processing step, a sampling frequency of the second digital signal sequence is multiplied by a rational number which varies. At the addition step, the digital signal sequence outputted at the first digital signal processing step and the digital signal sequence outputted at the second digital signal processing step are added. At the output step, a digital signal sequence added at the addition step is outputted from the output terminal. At the first digital signal processing step, determined is an integer by which the sampling frequency of the first digital signal sequence is multiplied for increasing the sampling frequency of the first digital signal sequence in order to adjust the sampling frequency of the first digital signal sequence to the sampling frequency of the output terminal. At the second digital signal processing step, determined is a rational number, by which the sampling frequency of the second digital signal sequence is multiplied in order to adjust the sampling frequency of the second digital signal sequence to the sampling frequency of the output terminal.

Effect of the Invention

The sampling rate conversion calculating apparatus according to the present invention is capable of speedily adjusting sampling frequencies of the conversational voice data, on which low delay is required, to a sampling frequency of the output terminal only through the interpolation processing performed by the first digital signal processing section. On the other hand, the sampling rate conversion calculating apparatus is capable of adjusting sampling frequencies of the audio data, on which processing higher precision, rather than the low delay, is required, to a sampling frequency of the output terminal with high precision through the interpolation processing and the decimation processing performed by the second digital signal processing section. Thus, the conversational voice data and the audio data are separately processed, thereby reducing a load exerted on a system and enhancing processing efficiency. And reducing the load exerted on the system allows a drastic reduction in hardware cost and power consumption.

BRIEF DESCRIPTION OF THE DRAWINGS

[FIG. 1] FIG. 1 is a block diagram illustrating a configuration of a sampling rate conversion calculating apparatus according to an embodiment of the present invention.

[FIG. 2] FIG. 2 is a diagram explaining signals processed by respective sections of the sampling rate conversion calculating apparatus.

[FIG. 3] FIG. 3 is a block diagram illustrating detailed exemplary configuration of an interpolation processing section 104.

FIG. 4 is a diagram showing a relationship between a digital signal sequence F1 inputted to the interpolation processing section 104 and a source signal.

FIG. 5 is a diagram showing the digital signal sequence F1 after zeros have been interpolated by an interpolator 1041.

FIG. 6 is a diagram showing a frequency component contained in the digital signal sequence F1 before interpolation of zeros.

FIG. 7 is a diagram showing a frequency component contained in the digital signal sequence F1 after passing through the interpolator 1041.

FIG. 8 is a diagram showing a frequency component contained in the digital signal sequence after passing through the interpolator 1042.

FIG. 9 is a diagram showing a value of the digital signal sequence F1 after passing through the interpolator 1042.

FIG. 10 is a block diagram illustrating detailed exemplary configuration of a decimation processing section 110.

FIG. 11 is a block diagram illustrating a hardware configuration of a digital data processing apparatus including the sampling rate conversion calculating apparatus.

FIG. 12 is a diagram illustrating a configuration of a sampling rate conversion calculating apparatus which combines digital signal sequences of two channels.

FIG. 13 is a diagram explaining a method for decreasing a sampling interval through a collinear approximation.

FIG. 14 is a block diagram illustrating a configuration of the sampling rate conversion calculating apparatus which decreases a sampling interval through the collinear approximation.

FIG. 15 is a block diagram illustrating a configuration of a conventional sampling rate conversion calculating apparatus.

[FIG. 16] FIG. 16 is a diagram explaining signals processed by respective sections of the conventional sampling rate conversion calculating apparatus.

Figure 4:
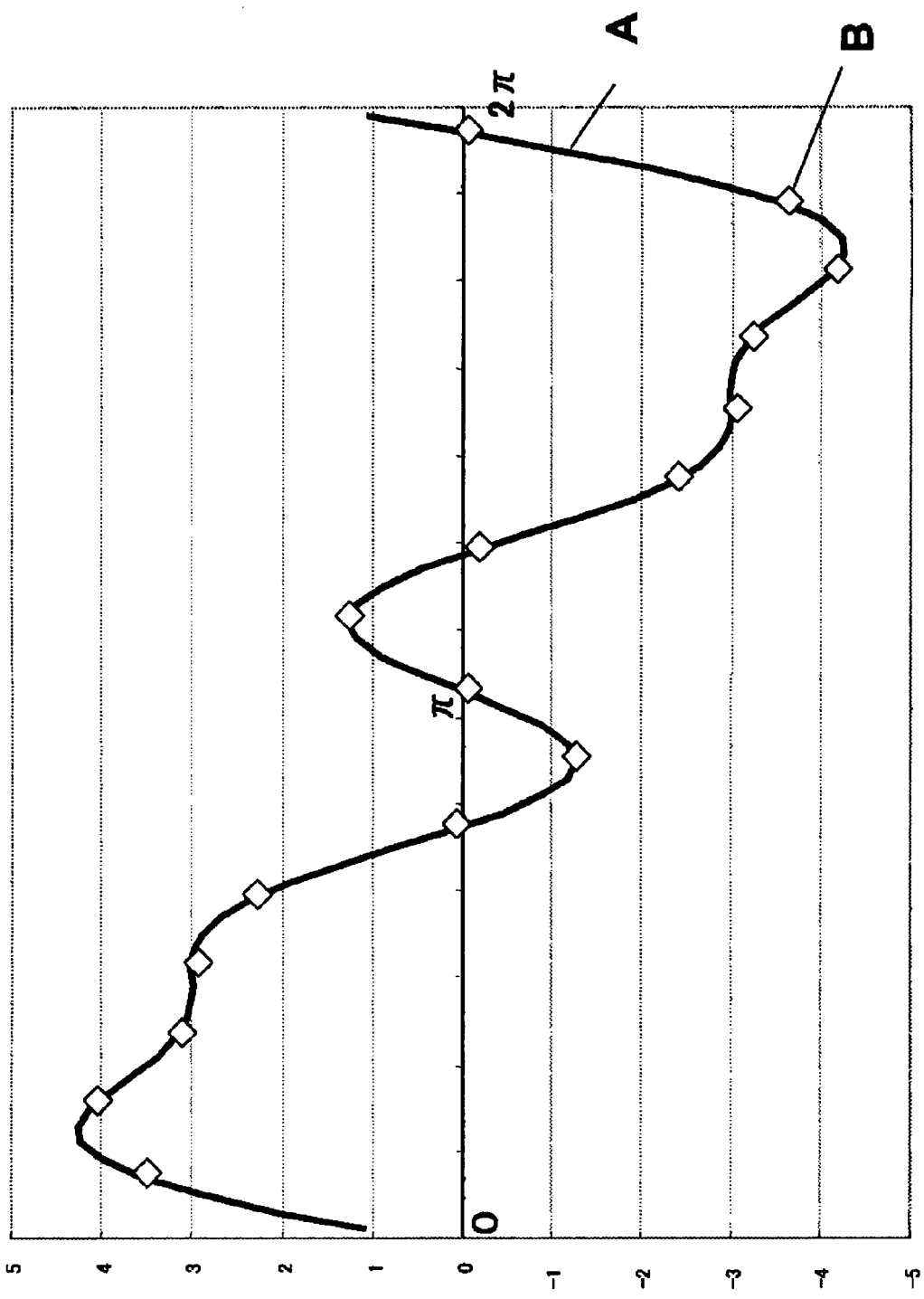
[FIG. 4]

DESCRIPTION OF THE REFERENCE CHARACTERS 101 to 103 and 301 input terminals
111 and 305 output terminals
104 to 106 and 304 interpolation processing sections
1041 interpolator 1042 interpolation filter
107 and 108 adder sections
109 buffer section
110 and 304 decimation processing sections
1101 decimation filter
1102 decimator
303 signal line Best Mode for Carrying Out the Invention Hereinafter an embodiment of the present invention will be described with reference to figures.

FIG. 1 is a block diagram illustrating a configuration of a sampling rate conversion calculating apparatus according to the embodiment of the present invention. FIG. 1 shows that the sampling rate conversion calculating apparatus in a case where digital signal sequences of three channels, which have different sampling frequencies, are combined. In the sampling rate conversion calculating apparatus shown in FIG. 1, the digital signal sequence inputted from one channel is conversational voice data and the digital signal sequences inputted from the other channels are audio data.

In FIG. 1, the sampling rate conversion calculating apparatus comprises input terminals 101 to 103, interpolation processing sections 104 to 106, a first adder section 107, a second adder section 108, a buffer section 109, a decimation processing section 110, and an output terminal 111. The first input terminal 101 and the first interpolation processing section 104 are collectively referred to as a first digital signal processing section. The input terminals 102 and 103, the interpolation processing sections 105 and 106, the second adder section 108, and the decimation processing section 110 are collectively referred to as a second digital signal processing section.

The digital signal sequences F1 to F3 are inputted from the input terminals 101 to 103. The interpolation processing sections 104 to 106 increase data amounts, through interpolation processing, by narrowing sampling intervals of the digital signal sequences F1 to F3 inputted from the input terminals 101 to 103. Here, the digital signal sequence F1 inputted from input terminal 101 is the conversational voice data and the digital signal sequences F2 and F3 inputted from the input terminals 102 and 103 are the audio data. Therefore, the interpolation processing section 104 processes the conversational voice data and the interpolation processing sections 105 and 106 processes the audio data.

FIG. 2 is a diagram explaining signals which respective sections of the sampling rate conversion calculating apparatus process. In FIG. 2, as the digital signal sequence F1, decode data of AMR, which has been sampled with 8 kHz in 384 kHz standard which is used for mobile communications, is inputted to the input terminal 101. As the digital signal sequence F2, decode data of AAC, which has been sampled with 44.1 kHz in 27 MHz which is used for broadcasting, is inputted to the input terminal 102. As the digital signal sequence F3, decode data of AAC, which has been sampled with 16 kHz in 384 kHz standard which is used for mobile communications, is inputted to the input terminal 103. And a sampling frequency of a digital signal sequence Fout outputted from the output terminal 111 is 32 kHz in 12 MHz in consideration of affinity with an MIDI apparatus etc. in which an internal clock is used.

As the digital signal sequences F1 to F3, decode data which has been sampled with frequencies other than these may be inputted to the sampling rate conversion calculating apparatus. For example, as the digital signal sequences F2 and F3, decode data of AAC, which has been sampled with 48 kHz, is inputted.

The decode data of AMR, inputted as the digital signal sequence F1, and the decode data of AAC, inputted as the digital signal sequence F3, are described in detail in WCDMA transmission specification TS25.133, TS25.211 by 3GPP (3rd Generation Partnership Project) and AMR Codec specification TS26.090 or the like. The decode data, inputted as the digital signal sequence F2, is described in detail in ARIB specification or the like.

The digital signal sequence F1 inputted from the input terminal 101 is inputted to the interpolation processing section 104. Through the interpolation processing, the interpolation processing section 101 adjusts a sampling frequency of the digital signal sequence F1, which is the conversational voice data, to a sampling frequency of the output terminal 111, and outputs a resultant. In this example, the interpolation processing section 104 increases the sampling frequency of the digital signal sequence F1 four times.

The digital signal sequences F2 and F3 inputted from the input terminals 102 and 103 are inputted to the interpolation processing sections 105 and 106. Through the interpolation processing, the interpolation processing sections 105 and 106 adjust sampling intervals of the digital signal sequence F2 and the digital sequence F3, which are the audio data, in order to coincide with each other, and output a resultant. In this example, interpolation processing section 105 increases the sampling frequency of the digital signal sequence F2 272 times. The interpolation processing section 106 increases the sampling frequency of the digital signal sequence F3 750 times.

The second adder section 108 adds the digital signal sequence outputted from the interpolation processing section 105 and the digital signal sequence outputted from the interpolation processing section 106. The decimation processing section 110 performs the decimation processing in order to adjust the sampling frequencies of the digital signal sequences outputted from the second adder section 108 to the sampling frequency of the output terminal 111, and outputs a resultant. A first adder section 107 adds the audio data which has been decimation-processed by the decimation processing section 110 and the conversational voice data which has been interpolation-processed by the interpolation processing section 104. The buffer section 109 is a buffer for accumulating the decimated audio data.

In other words, the first digital signal processing section (the interpolation processing section 104) increases the sampling frequency of the digital signal sequence F1 by multiplying the sampling frequency of the digital signal sequence F1 by an integer (4 times in this example) in order to adjust the sampling frequency of the digital signal sequence F1 to the sampling frequency of the output terminal 101. The second digital signal processing section (the interpolation processing sections 105 and 106, the second adder section 108, and the decimation processing section 110) multiplies the sampling frequencies of the digital signal sequences F2 and F3 by a rational number (272/375 times for the digital signal sequence F2 and 750/375 times for the digital signal sequence F3 in this example) which varies, in order to adjust the sampling frequencies of the digital signal sequences F2 and F3 to the sampling frequency of the output terminal 101.

In the above-mentioned configuration, the sampling rate conversion calculating apparatus is only required to perform the interpolation processing, which is adjusted to the output terminal 111, for the conversational voice data (digital signal sequence F1) inputted from the input terminal 101 and not required to perform the decimation processing which the conventional sampling rate conversion calculating apparatus is required to perform. In other words, since the decimation processing section 110 is not required to perform the decimation processing for the conversational voice data (digital signal sequence F1), the decimation processing section 110 does not have to be activated frequently. And since the integer for the multiplication, which is used for the interpolation processing, is that used for the output terminal 111, the data amount of the conversational voice data in the above-mentioned example increases only by up to 4 times. In addition, since the data amount is decreased, a load on the first adder section 107 is also decreased.

The delay of one to several seconds occurs while processing stream data of audio etc. does not make a serious issue. Therefore, by connecting the buffer section 109 to an input port, for the audio data, of the first adder section 107, processing timing at the second digital signal processing section (i.e., the interpolation processing sections 105 and 106, the second adder section 108, and the decimation processing section 110) which is required to perform a large amount of calculation can be separated from processing timing for the conversational voice data which is processed at a low bit rate and in a highly frequent processing. Thus the sampling rate conversion calculating apparatus is capable of efficiently operating, by utilizing idle time of the system, a series of processes, which are performed by the second digital signal processing section. In the meantime, the buffer section 109 is not an essential component for the sampling rate conversion calculating apparatus.

Next, with reference to FIGS. 3 to 10, the interpolation processing section 104 and decimation processing section 110 will be described in detail. FIG. 3 is a block diagram illustrating a detailed exemplary configuration of the interpolation processing section 104. In FIG. 3, the interpolation processing section 104 includes an interpolator 1041 and an interpolation filter 1042. A configuration of the interpolation processing section 105 and a configuration of the interpolation processing section 106 are similar to the configuration shown in FIG. 3.

FIG. 4 is a diagram showing a relationship between the digital signal sequence F1 inputted to the interpolation processing section 104 and a source signal. In FIG. 4, a vertical axis shows a value (intensity) of the digital signal sequence F1 and a horizontal axis shows time. As shown in FIG. 4, the source signal (reference mark A) indicated by a continuous line is inputted to the interpolation processing section 104 as the digital signal sequence F1 indicated by rhombus points (reference mark B).

Figure 5:
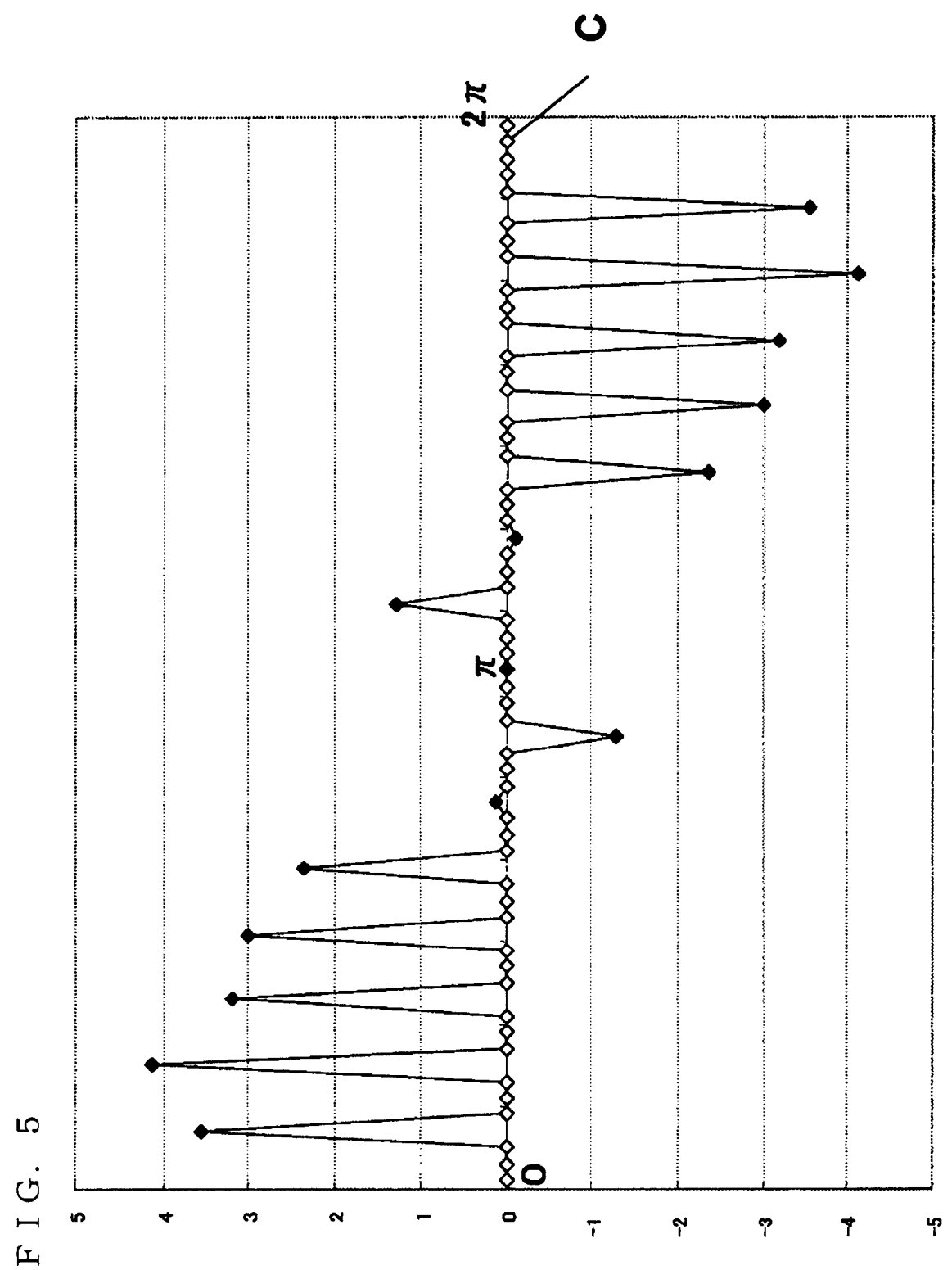
[FIG. 5]
Figure 6:
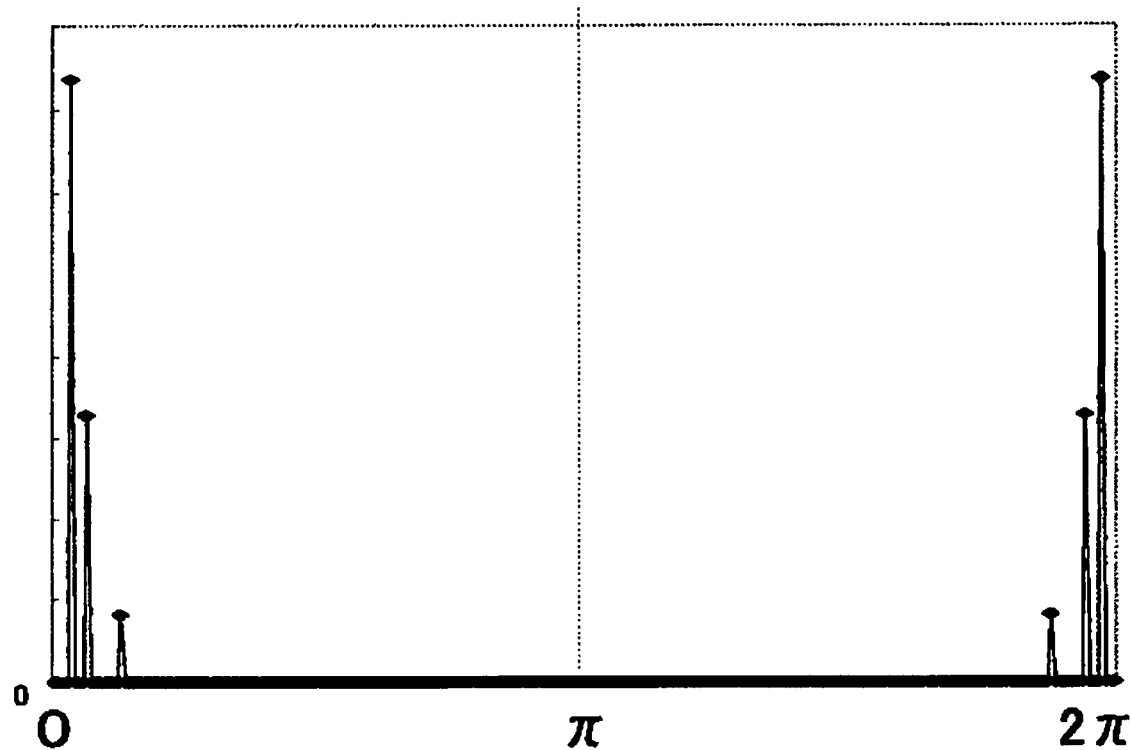
[FIG. 6]

The interpolator 1041 interpolates, with a required number of zeros, the digital signal sequence F1 inputted from the input terminal 101. FIG. 5 is a diagram showing the digital signal sequence F1 after the in interpolation of zeros by the interpolator 1041. Here, the interpolator 1041 narrows, to ¼, a sampling interval of the digital signal sequence F1. In FIG. 5, a rhombus point (reference mark C) indicates an interpolated zero. The digital signal sequence F1 which has zeros interpolated through the interpolator 1041 includes a signal component of a high frequency, other than the source signal, when observed with respect to a frequency component. FIG. 6 is a diagram showing a frequency component contained in the digital signal sequence F1 before the interpolation of zeros.

Figure 7:
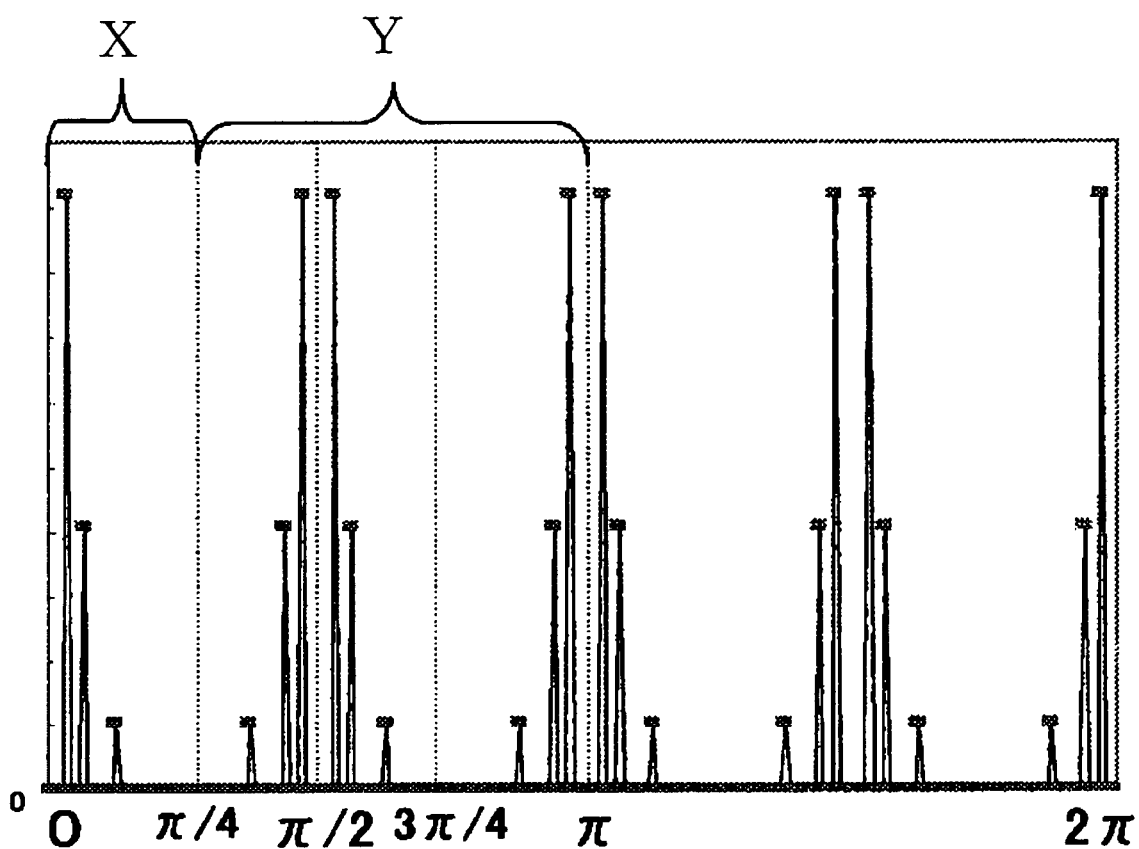
[FIG. 7]
Figure 8:
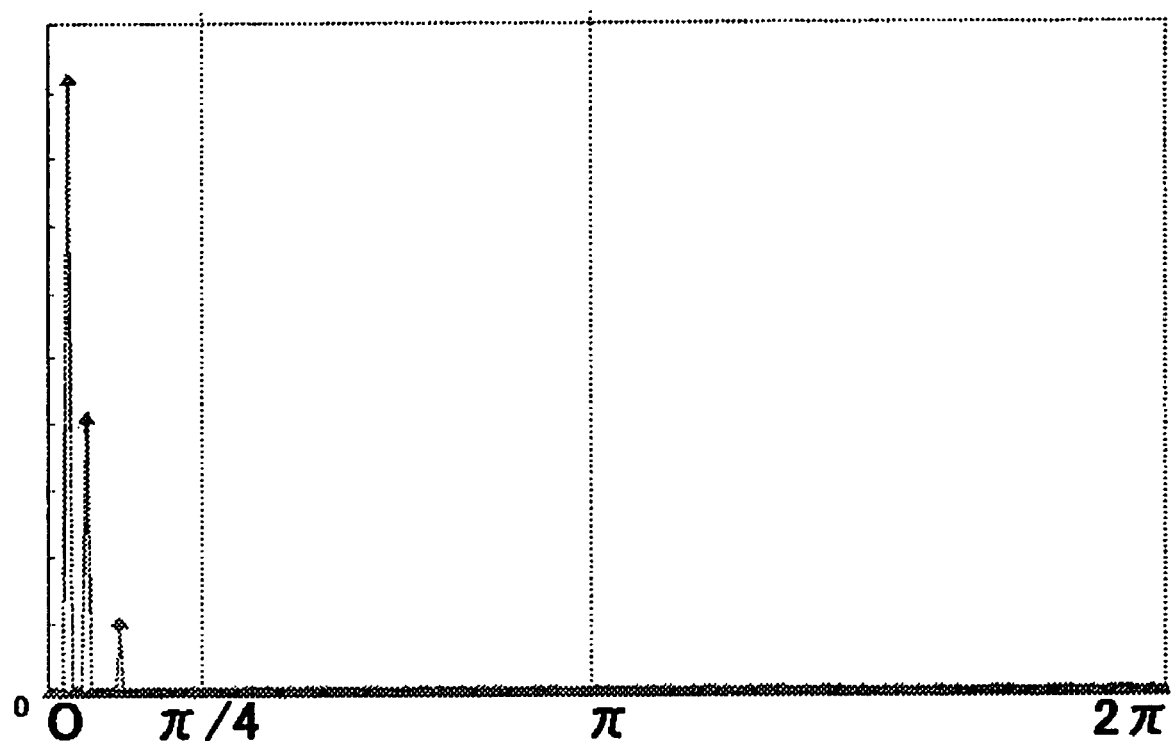
[FIG. 8]

FIG. 7 is a diagram showing a frequency component contained in the digital signal sequence F1 after having passing through the interpolator 1041. In FIG. 7, a range indicated by 0 to $\pi/4$ (reference mark X) is a component contained in the source signal and a range indicated by $\pi/4$ to $\pi$ (reference mark Y) is a component contained as noise through the interpolation of zeros. In other words, it can be seen that digital signal sequence F1 having passing through the interpolator 1041 contains three components (images) through the interpolation of three zeros.

In FIG. 7, a component equal to or greater than $\pi$ and a component equal to or less than $\pi$ appear to be symmetrical and a component from $\pi/4$ to is a noise component contained through the interpolation of zeros. Therefore, by using a lowpass filter (image removing filter) which passes only a component from 0 to $\pi/4$, the digital signal sequence F1 having passing through the interpolator 1041 is made a signal containing a frequency component, shown in FIG. 8. In other words, an original signal component can be restored from the signal containing the noise component. The interpolation filter 1042 performs this filter processing. A typical lowpass filter used for the digital signal processing is an FIR filter. However, description thereof will be omitted because of no relationship with an essential feature of the present invention.

Figure 9:
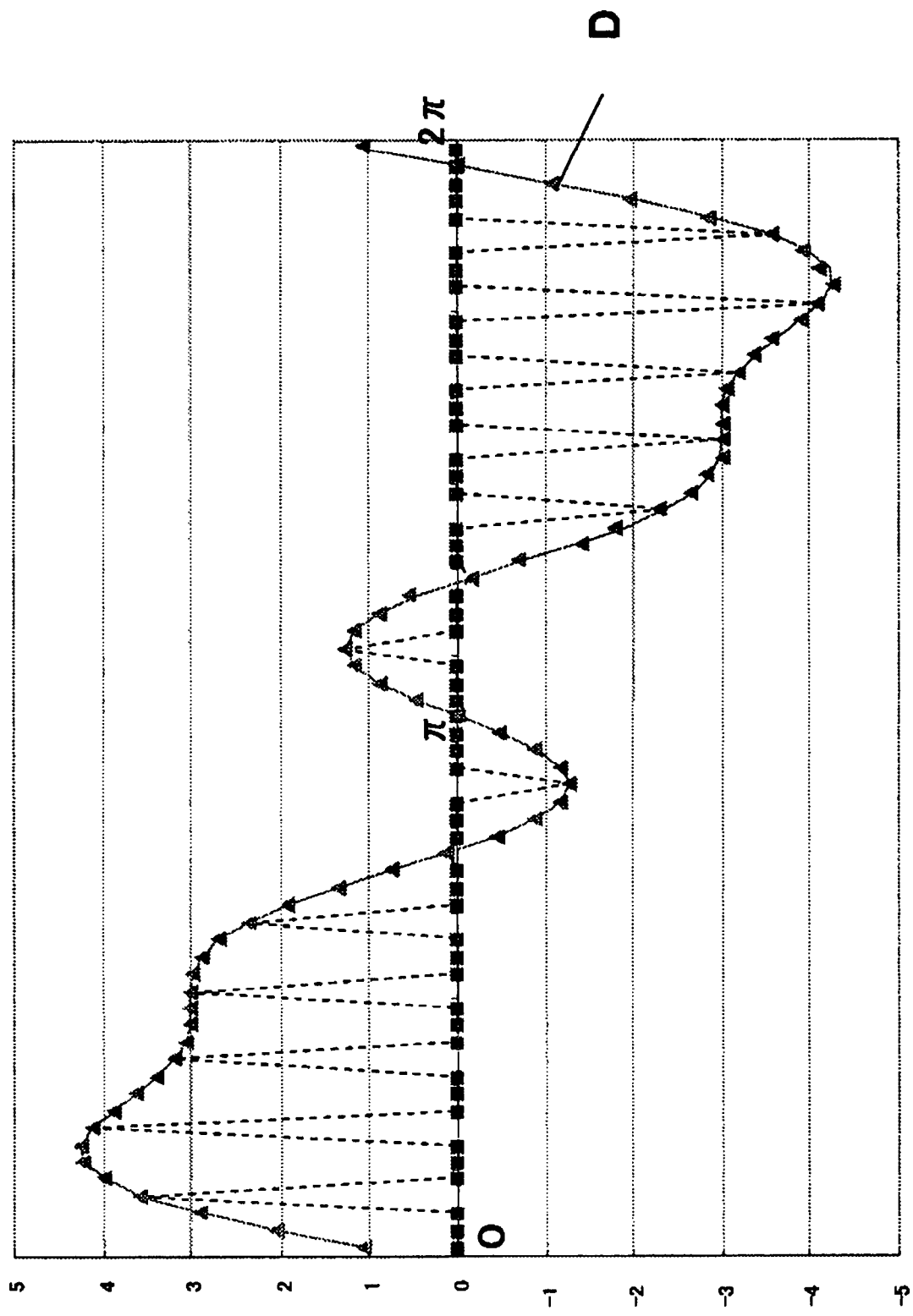
[FIG. 9]

FIG. 9 is a diagram showing a value of the digital signal sequence F1 after having passed through the interpolation filter 1042. It can be seen that since the digital signal sequence F1 shown in FIG. 9 has removed the noise component and contains only the original signal component, the digital signal sequence F1 shows a smooth curve as indicated by triangular points (reference mark D).

Figure 10:
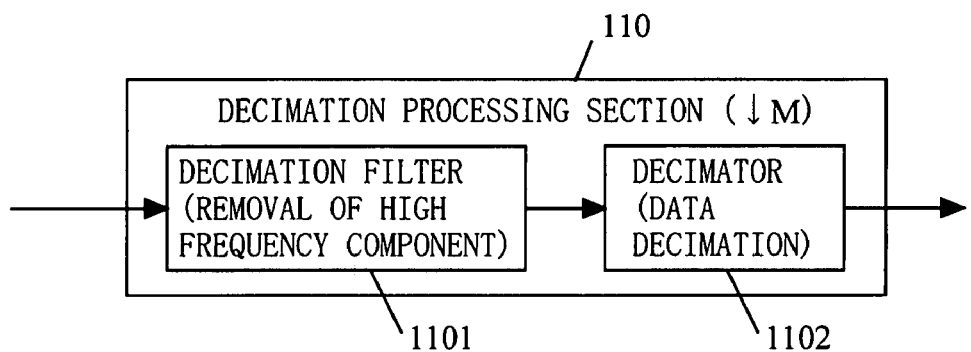
[FIG. 10]

FIG. 10 is a block diagram illustrating a detailed exemplary configuration of the decimation processing section 110. In FIG. 10, the decimation processing section 110 includes a decimation filter 1101 and a decimator 1102. The digital signal sequence inputted to the decimation processing section 110 is inputted to the decimation filter 1101. The decimation filter 1101 is a lowpass filter and removes a high-frequency component of the inputted digital signal sequence according to a sampling interval after decimation by the decimator 1102. The decimator 1102 increases a sampling interval of the inputted digital signal sequence by multiplying the sampling interval of the inputted digital signal sequence by the integer in order to adjust the sampling interval of the inputted digital signal sequence to a sampling frequency of the output terminal 111.

Figure 11:
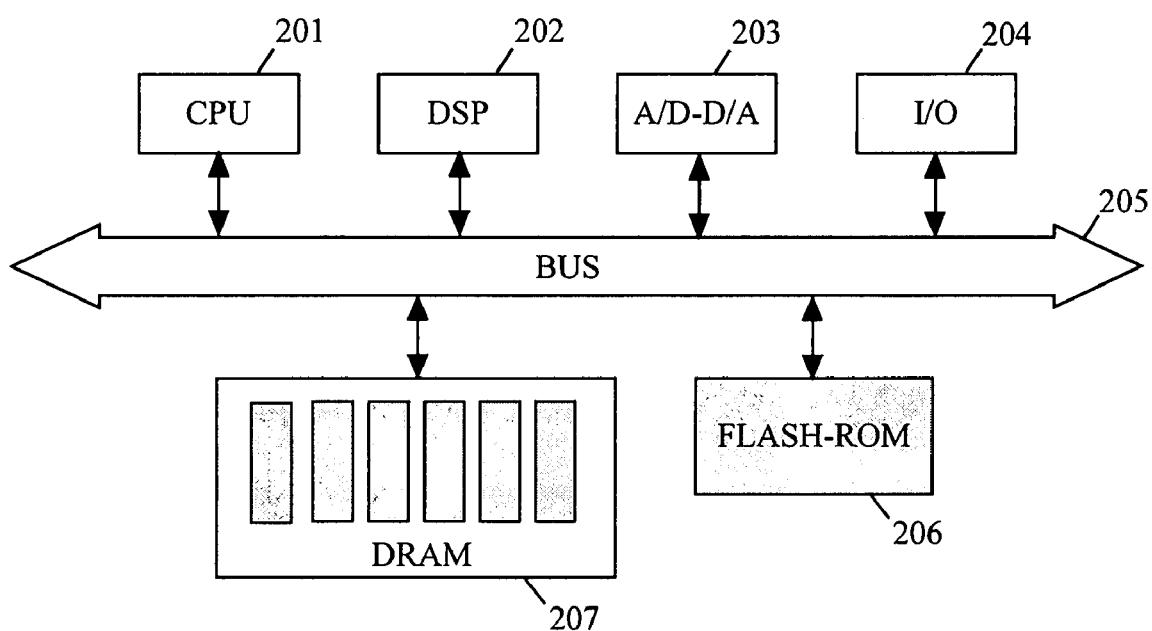
[FIG. 11]

The sampling rate conversion calculating apparatus according to the present invention is operable, for example, in a digital data processing apparatus shown in FIG. 11. The digital data processing apparatus is, for example, an audio apparatus, a video apparatus, a personal computer, and a personal digital assistant etc. In FIG. 11, the digital data processing apparatus comprises a CPU 201, a DSP 202, an A/D-D/A converter 203, an I/O controller 204, a bus 205, a flash ROM 206, and a DRAM 207. The flash ROM 206 stores programs executed by a CPU and a DSP. The DRAM 207 stores intermediate data etc. in various processes.

As described above, the sampling rate conversion calculating apparatus according to the embodiment of the present invention is capable of speedily adjusting sampling frequencies of the conversational voice data, on which low delay is required, to a sampling frequency of the output terminal 111 only through the interpolation processing performed by the first digital signal processing section. On the other hand, the sampling rate conversion calculating apparatus is capable of adjusting, with high precision, the sampling frequencies of the audio data, on which processing precision, rather than the low delay, is required, to a sampling frequency of the output terminal 111 through the interpolation processing and the decimation processing performed by the second digital signal processing section. Thus, the conversational voice data and the audio data are separately processed, thereby reducing a load exerted on a system and enhancing processing efficiency. And reducing the load exerted on the system allows a drastic reduction in hardware cost and power consumption.

Figure 12:
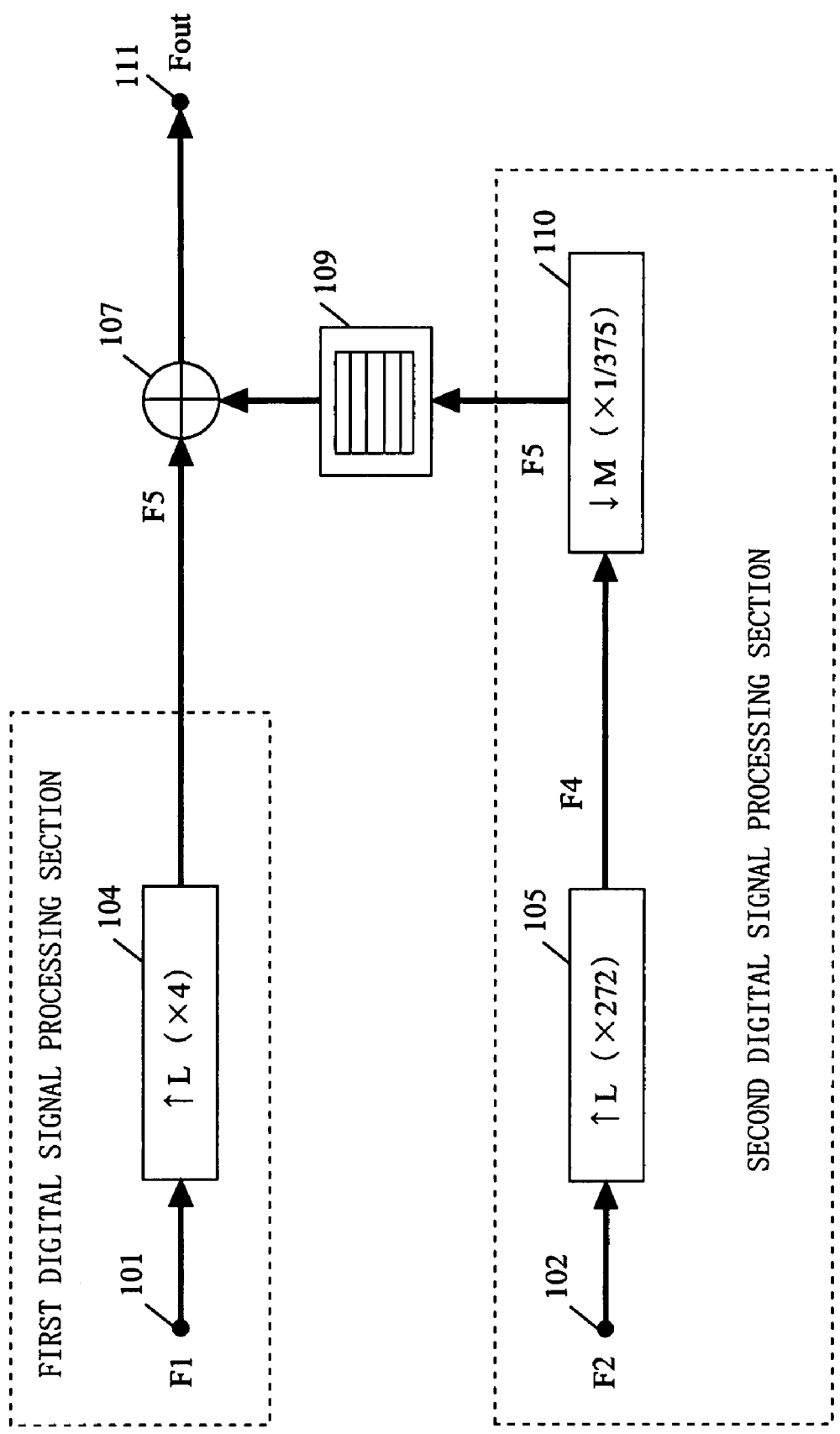
[FIG. 12]

Although in the above description, an example in which the sampling rate conversion calculating apparatus combines the digital signal sequences of three channels, which have the different sampling frequencies is shown, a number of combined channels is not limited to three. For example, the sampling rate conversion calculating apparatus may combine digital signal sequences of two channels (see FIG. 12) or digital signal sequences of four or more channels. FIG. 12 is a diagram illustrating a configuration of a sampling rate conversion calculating apparatus which combines the digital signal sequences of two channels.

The sampling rate conversion calculating apparatus shown in FIG. 12 is capable of speedily adjusting sampling frequencies of conversational voice data (or a digital signal sequence whose sampling frequency is an integral multiple of a sampling frequency of the output terminal 111), on which low delay is required, to a sampling frequency of the output terminal 111, on which low delay, is required, only through the interpolation processing performed by the first digital signal processing section. On the other hand, the sampling rate conversion calculating apparatus shown in FIG. 12 is capable of adjusting, with high precision, sampling frequencies of audio data (or a digital signal sequence whose sampling frequency is not an integral multiple of a sampling frequency of the output terminal 111), on which processing precision, rather than the low delay, is required, to a sampling frequency of the output terminal 111 through the interpolation processing and the decimation processing performed by the second digital signal processing section. Thus, the digital signal sequence F1 and the digital signal sequence F2 are separately processed, thereby reducing a load on a system and enhancing processing efficiency.

Figure 13:
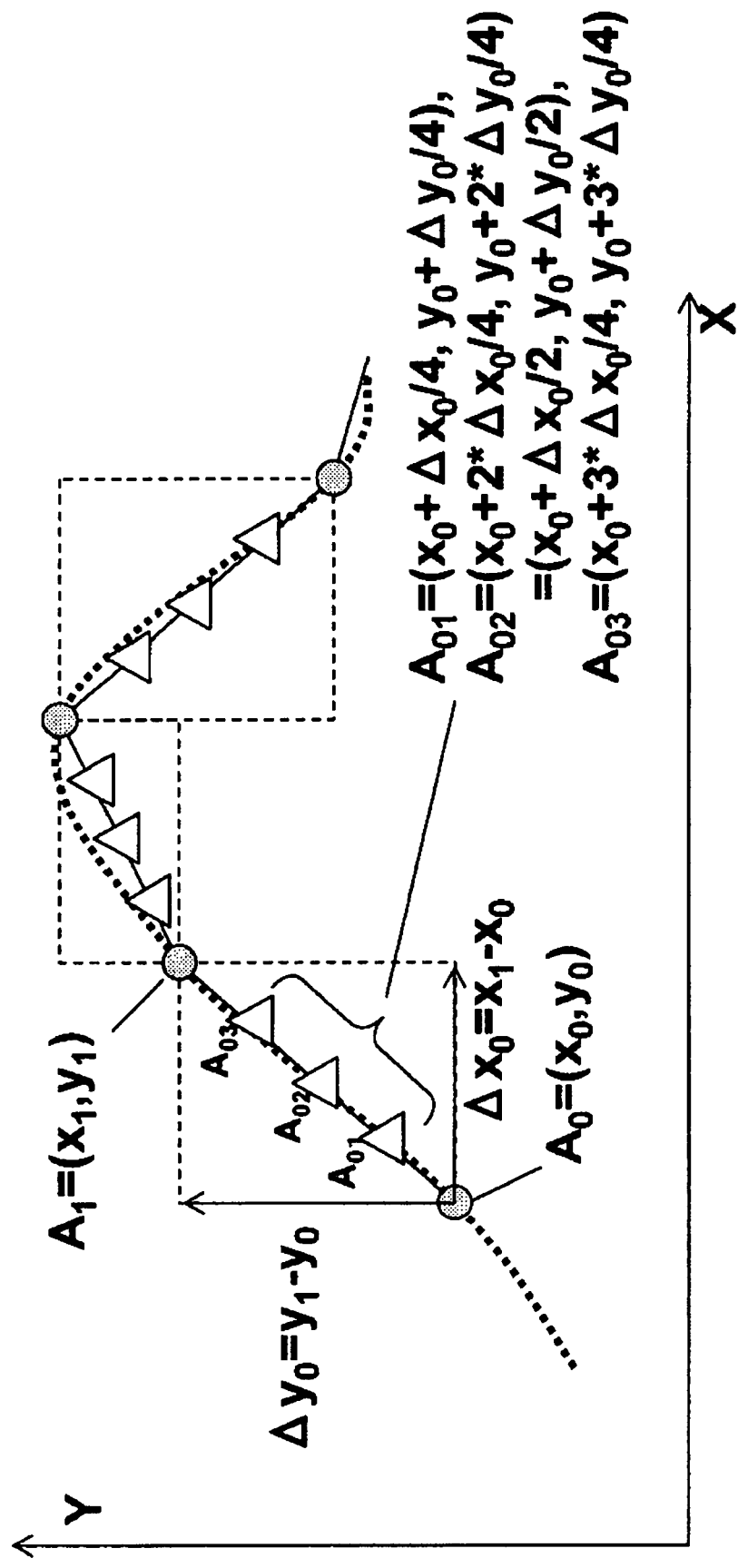
[FIG. 13]
Figure 14:
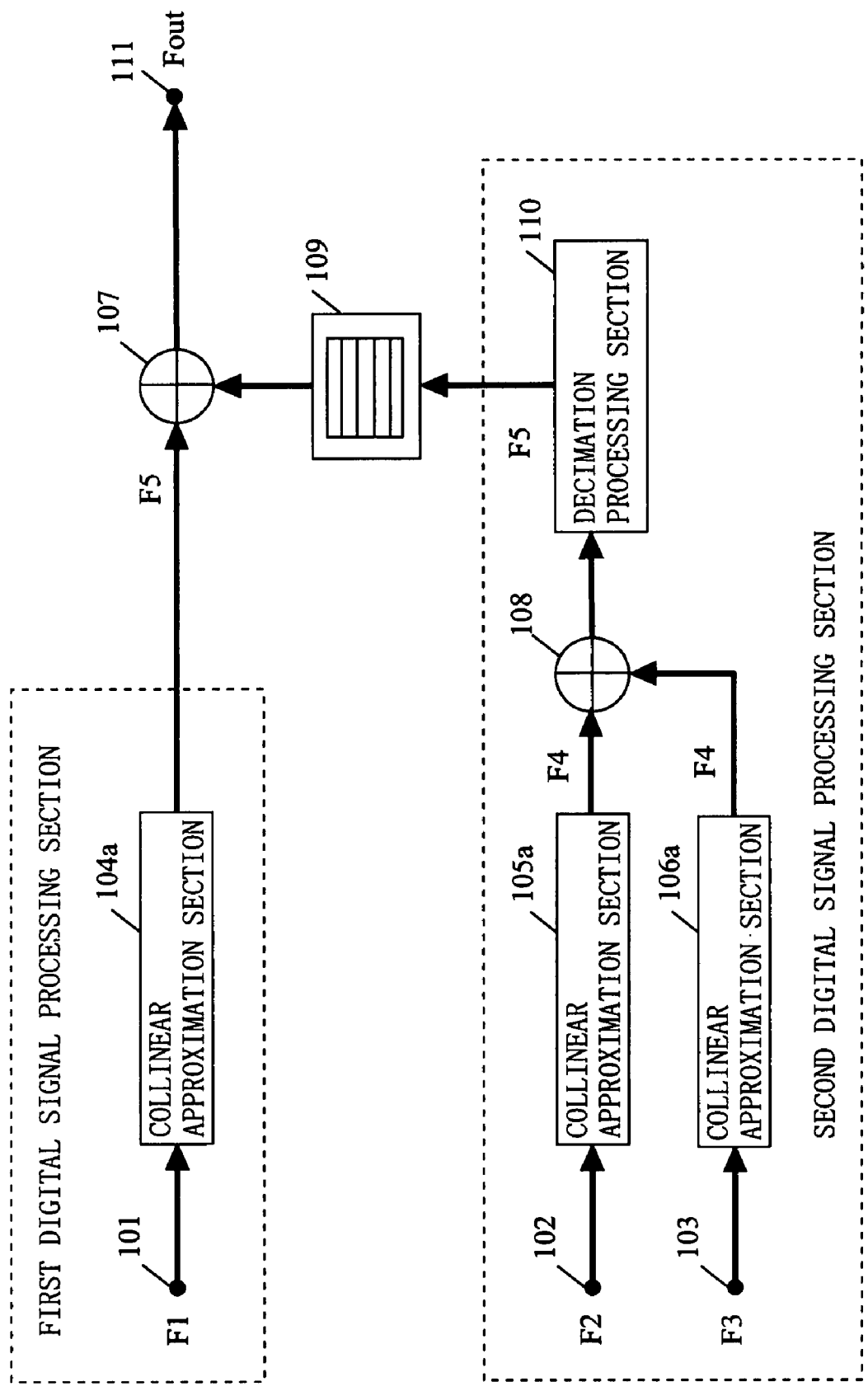
[FIG. 14]
Figure 15:
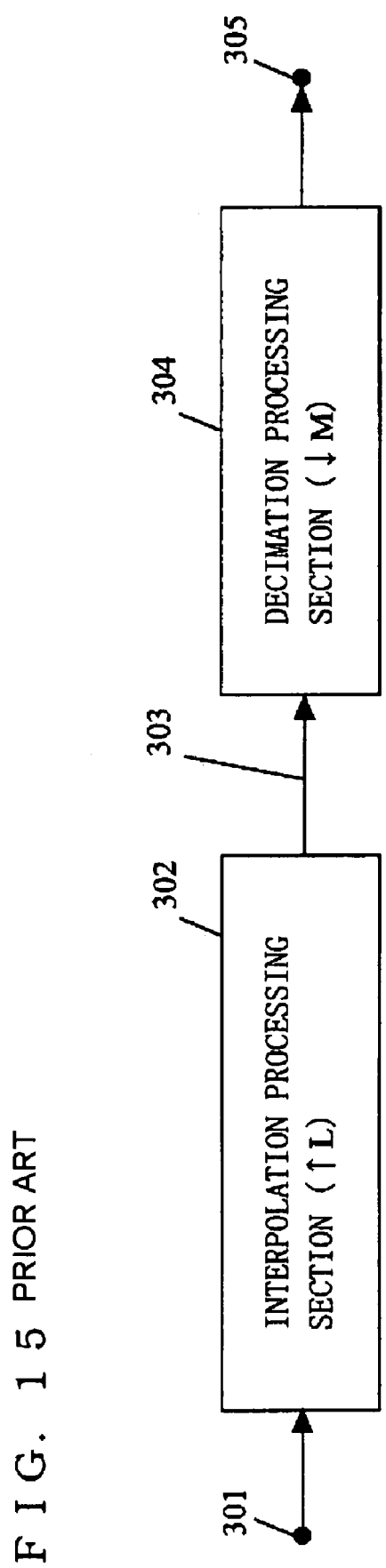
[FIG. 15]

Although the sampling rate conversion calculating apparatus of the present invention reduces the sampling intervals of the digital signal sequences through the interpolation processing, if multiple number to be reduced are small, a method for reducing the sampling intervals of the digital signal sequences by using collinear approximation as shown in FIG. 13 may be considered. FIG. 14 is a block diagram illustrating a configuration of a sampling rate conversion calculating apparatus which reduces sampling intervals through the collinear approximation. In this case, the sampling rate conversion calculating apparatus comprises collinear approximation sections 104a, 105a, and 106a, instead of the interpolation processing sections 104 to 106, which reduces the sampling intervals through the collinear approximation.

In the above description, addition processing of the digital signal sequences is described. If conditions of establishing the linear time invariant system are satisfied, by separately performing subtraction processing for the digital signal sequences, processing by various filters etc., similar effect can be obtained.

In the sampling rate conversion calculating apparatus, operations of functional blocks such as the interpolation processing sections 104 to 106, the first adder section 107, the second adder section 108, and the decimation processing section 110 may be performed by a program. This program may be executed by one CPU or processes of the functional blocks may be separately executed by a plurality of CPUs.

Functional blocks such as the interpolation processing sections 104 to 106, the first adder section 107, the second adder section 108, and the processing section 110 may be realized as an LSI, which is typically an integrated circuit. These functional blocks may be constructed in a chip form, or may be constructed in a chip form in order to include a part or all of the functional blocks. The LSI may be referred to as an IC, a system LSI, a super LSI, or an ultra LSI, etc., depending on the degree of integration. Also, the method of integration is not limited to LSI, and may be realized by a dedicated circuit or a general purpose processor. Also, an FPGA (Field Programmable Gate Array), which is an LSI that can be programmed after manufacture, or a reconfigurable processor enabling connections and settings of the circuit cells in the LSI to be reconfigured may be used. Further, in the case where another integration technology replacing the LSI becomes available due to improvement of a semiconductor technology or due to emergence of another technology derived therefrom, integration of the functional blocks may be performed using such a new integration technology. For example, biotechnology may be applied to the above-described integration.

INDUSTRIAL APPLICABILITY

The sampling rate conversion calculating apparatus of the present invention is useful as a technology for realizing high-performance audio mixer etc.

The invention claimed is:

1. A sampling rate conversion calculating apparatus which converts two or more digital signal sequences which have different sampling frequencies into the same sampling frequency, comprising:
    a first digital signal processing section for increasing a sampling frequency of the first digital signal sequence by multiplying the sampling frequency of the first digital signal sequence by an integer;
    a second digital signal processing section for multiplying a sampling frequency of the second digital signal sequence by a rational number which varies;
    an adder section for adding the digital signal sequence outputted from the first digital signal processing section and the digital signal sequence outputted from the second digital signal processing section; and
    an output terminal for outputting a digital signal sequence into which the adder section adds the digital signal sequences, wherein
    the first digital signal processing section determines the integer by which the sampling frequency of the first digital signal sequence is multiplied for increasing the sampling frequency of the first digital signal sequence in order to adjust the sampling frequency of the first digital signal sequence to the sampling frequency of the output terminal, and
    the second digital signal processing section determines a rational number, by which the sampling frequency of the second digital signal sequence is multiplied in order to adjust the sampling frequency of the second digital signal sequence to the sampling frequency of the output terminal.

2. The sampling rate conversion calculating apparatus according to claim 1, wherein
    the first digital signal sequence is conversational voice data, and
    the first digital signal processing section increases the sampling frequency of the conversational voice data by multiplying the sampling frequency of the conversational voice data by the integer.

3. The sampling rate conversion calculating apparatus according to claim 1, wherein the second digital signal sequence is audio data, and
the second digital signal processing section multiplies the sampling frequency of the audio data by a rational number which varies.

4. The sampling rate conversion calculating apparatus according to claim 1, further comprising a buffer, between the adder section and the second digital signal processing section, for temporarily storing the digital signal sequence outputted by the second digital signal processing section.

5. The sampling rate conversion calculating apparatus according to claim 1, wherein the first digital signal processing section includes
an input terminal to which the first digital signal sequence is inputted, and
an interpolation processing section for increasing the sampling frequency of the first digital signal sequence by multiplying the sampling frequency of the first digital signal sequence by the integer.

6. The sampling rate conversion calculating apparatus according to claim 1, wherein the second digital signal processing section includes:
an input terminal to which the second digital signal sequence is inputted;
an interpolation processing section for increasing the sampling frequency of the second digital signal sequence by multiplying the sampling frequency of the second digital signal sequence by the integer; and
a decimation processing section for decreasing the sampling frequency of the digital signal sequence by multiplying the sampling frequency of the digital signal sequence outputted by the interpolation processing section by a reciprocal of the integer in order to adjust the sampling frequency of the digital signal sequence to the sampling frequency of the output terminal.

7. The sampling rate conversion calculating apparatus according to claim 1, wherein the second digital signal processing section includes:
a plurality of input terminals to which the plurality of digital signal sequences including the second digital signal sequence are inputted;
a plurality of interpolation processing sections for increasing the sampling frequencies of the plurality of digital signal sequences by respectively multiplying the sampling frequencies of the plurality of digital signal sequences by the integer so that the sampling frequencies of the plurality of digital signal sequences are adjusted to coincide with each other;
a second adder section for adding the digital signal sequences outputted by the plurality of interpolation processing sections; and
a decimation processing section for decreasing the sampling frequencies of the digital signal sequences by multiplying the sampling frequencies of the digital signal sequences outputted by the second adder section by a reciprocal of the integer in order to adjust the sampling frequencies of the digital signal sequences to the sampling frequency of the output terminal.

8. The sampling rate conversion calculating apparatus according to claim 1, where the first digital signal processing section includes
an input terminal to which the first digital signal sequence is inputted, and
a collinear approximation section for increasing the sampling frequency of the first digital signal sequence by multiplying the sampling frequency of the first digital signal sequence by the integer.

9. The sampling rate conversion calculating apparatus according to claim 1, wherein the second digital signal processing section includes:
an input terminal to which the second digital signal sequence is inputted;
a collinear approximation section for increasing the sampling frequency of the second digital signal sequence by multiplying the sampling frequency of the second digital signal sequence by the integer; and
a decimation processing section for decreasing the sampling frequency of the digital signal sequence by multiplying the sampling frequency of the digital signal sequence outputted by the collinear approximation section by a reciprocal of the integer in order to adjust the sampling frequency of the digital signal sequence to the sampling frequency of the output terminal.

10. The sampling rate conversion calculating apparatus according to claim 1, wherein the second digital signal processing section includes:
a plurality of input terminals to which the plurality of digital signal sequences including the second digital signal sequence are inputted;
a plurality of collinear approximation sections for increasing the sampling frequencies of the plurality of digital signal sequences by respectively multiplying the sampling frequencies of the plurality of digital signal sequences by the integer so that the sampling frequencies of the plurality of digital signal sequences are adjusted to coincide with each other;
a second adder section for adding the digital signal sequences outputted by the plurality of collinear approximation section; and
a decimation processing section for decreasing the sampling frequencies of the digital signal sequences by multiplying the sampling frequencies of the digital signal sequences outputted by the second adder section by a reciprocal of the integer in order to adjust the sampling frequencies of the digital signal sequences to the sampling frequency of the output terminal.

11. The sampling rate conversion calculating apparatus according to claim 1, wherein the sampling frequency of the output terminal is a multiple of the sampling frequency of conversational voice data.

12. The sampling rate conversion calculating apparatus according to claim 1, wherein a reference frequency of the sampling frequency of the digital signal sequence to be inputted to the second digital signal processing section is either one of 27 MHz, 382 kHz, and 12 MHz.

13. A conversion method for converting two or more digital signal sequences which have different sampling frequencies into the same sampling frequency, comprising:
a first digital signal processing step of increasing the sampling frequency of the first digital signal sequence by multiplying a sampling frequency of the first digital signal sequence by an integer;
a second digital signal processing step of multiplying a sampling frequency of the second digital signal sequence by a rational number which varies;
an addition step of adding the digital signal sequence outputted at the first digital signal processing step and the digital signal sequence outputted at the second digital signal processing step; and
an output step of outputting from the output terminal the digital signal sequences added at the addition step, wherein
at the first digital signal processing step, determined is an integer by which the sampling frequency of the first digital signal sequence is multiplied for increasing the sampling frequency of the first digital signal sequence in order to adjust the sampling frequency of the first digital signal sequence to the sampling frequency of the output terminal, and at the second digital signal processing step, determined is a rational number, by which the sampling frequency of the second digital signal sequence is multiplied in order to adjust the sampling frequency of the second digital signal sequence to the sampling frequency of the output terminal.

14. An integrated circuit for converting two or more digital signal sequences which have different sampling frequencies into the same sampling frequency, comprising:

a first digital signal processing step of increasing a sampling frequency of the first digital signal sequence by multiplying the sampling frequency of the first digital signal sequence by an integer;

a second digital signal processing step of multiplying a sampling frequency of the second digital signal sequence by a rational number which varies;

an addition step of adding the digital signal sequence outputted at the first digital signal processing step and the digital signal sequence outputted at the second digital signal processing step; and an output step of outputting from the output terminal a digital signal sequence added at the addition step, wherein at the first digital signal processing step, determined is an integer by which the sampling frequency of the first digital signal sequence is multiplied for increasing the sampling frequency of the first digital signal sequence in order to adjust the sampling frequency of the first digital signal sequence to the sampling frequency of the output terminal, and at the second digital signal processing step, determined is a rational number, by which the sampling frequency of the second digital signal sequence is multiplied in order to adjust the sampling frequency of the second digital signal sequence to the sampling frequency of the output terminal.

* * * * *